(12) United States Patent
Moon et al.

(10) Patent No.: US 9,062,857 B2
(45) Date of Patent: Jun. 23, 2015

(54) LIGHT EMITTING DEVICE MODULE

(75) Inventors: Yontae Moon, Seoul (KR); Eunseon Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 689 days.

(21) Appl. No.: 13/090,702

(22) Filed: Apr. 20, 2011

(65) Prior Publication Data

US 2012/0002427 A1 Jan. 5, 2012

(30) Foreign Application Priority Data

Jul. 5, 2010 (KR) ........................ 10-2010-0064488

(51) Int. Cl.
| | | |
|---|---|---|
| H01R 33/00 | (2006.01) | |
| F21V 19/00 | (2006.01) | |
| F21K 99/00 | (2010.01) | |
| F21V 21/35 | (2006.01) | |
| F21Y 101/02 | (2006.01) | |
| H01L 33/48 | (2010.01) | |
| F21Y 111/00 | (2006.01) | |

(52) U.S. Cl.
CPC ............... F21V 19/0045 (2013.01); F21K 9/00 (2013.01); F21V 19/001 (2013.01); F21V 21/35 (2013.01); F21Y 2101/02 (2013.01); H01L 33/486 (2013.01); F21K 9/17 (2013.01); F21Y 2111/005 (2013.01); H01L 2224/48091 (2013.01)

(58) Field of Classification Search
CPC .... F21V 19/001; F21V 19/0045; F21V 21/35
USPC ......... 362/147, 640, 648, 382, 655, 656, 652; 361/760; 439/110
See application file for complete search history.

(56) References Cited

U.S. PATENT DOCUMENTS

| | | | |
|---|---|---|---|
| 4,471,415 A | 9/1984 | Larson et al. | |
| 4,999,755 A | 3/1991 | Lin | |
| 5,975,716 A | 11/1999 | McSwiggen et al. | |
| 7,033,060 B2* | 4/2006 | Dubuc | 362/600 |
| 2006/0082315 A1 | 4/2006 | Chan | |
| 2007/0252161 A1 | 11/2007 | Meis et al. | |
| 2008/0149373 A1* | 6/2008 | Kim et al. | 174/255 |
| 2009/0244909 A1* | 10/2009 | Chen | 362/368 |

FOREIGN PATENT DOCUMENTS

| | | |
|---|---|---|
| CN | 2690732 | 4/2005 |
| CN | 201166344 | 12/2008 |
| KR | 100898548 | 5/2009 |

OTHER PUBLICATIONS

Chinese Office Action issued in Application No. 201110133099.9 dated Jun. 3, 2013.
European Search Report issued in Application No. 11163595.9 dated Feb. 27, 2015.

* cited by examiner

Primary Examiner — Anh Mai
Assistant Examiner — Zachary J Snyder
(74) Attorney, Agent, or Firm — Ked & Associates LLP

(57) ABSTRACT

A light emitting device module is provided comprising a light emitting device package and a printed circuit board to which the light emitting device package is coupled, wherein the light emitting device package includes a sliding groove and a fixing groove, and wherein the printed circuit board includes a sliding protrusion coupled to the sliding groove to guide the light emitting device package to a predetermined position and a fixing protrusion coupled to the fixing groove at the predetermined position.

15 Claims, 15 Drawing Sheets

LIGHT EMITTING DEVICE MODULE

CROSS-REFERENCE TO RELATED APPLICATION

This application claims the priority benefit of Korean Patent Application No. 10-2010-0064488, filed on Jul. 5, 2010 in the Korean Intellectual Property Office, the disclosure of which is incorporated herein by reference.

BACKGROUND OF THE EMBODIMENT

1. Technical Field

Exemplary embodiments are directed to a light emitting device module, and more specifically to a light emitting device module that includes a light emitting device package and a printed circuit board, wherein the light emitting device package is easily detachable from the printed circuit board.

2. Discussion of the Related Art

In general, a light emitting diode (LED) includes a light emitting device, lead pins for power feeding, and a sealing material for protecting the light emitting device. A diversity of light emitting devices may emit infrared beams, ultraviolet rays, or visible rays. Light emitting device packages have various applications, such as sensors, displays, or illumination.

The lead pins of the light emitting device package are connected to electrodes formed on a printed circuit board or a power cable to supply power to the light emitting device package.

The lead pins of the light emitting device package include +/− lead pins. Each of the lead pins may have a cross section of a circle or a rectangle. The lead pins may be soldered to a power cable directly or via a separate printed circuit board.

The connection between the light emitting device package and the power cable or printed circuit board by soldering requires separate soldering tools, and this is burdensome in general households or outdoors. Although a socket may be used for connection between the light emitting device package and the printed circuit board, the socket also needs to be subjected to soldering for fixation. This incurs additional costs.

SUMMARY OF THE EMBODIMENT

Exemplary embodiments provide a light emitting device module wherein a light emitting device package may be easily detached from a printed circuit board.

According to an embodiment, there is provided a light emitting device module comprising a light emitting device package and a printed circuit board to which the light emitting device package is coupled, wherein the light emitting device package includes a sliding groove and a fixing groove, and wherein the printed circuit board includes a sliding protrusion coupled to the sliding groove to guide the light emitting device package to a predetermined position and a fixing protrusion coupled to the fixing groove at the predetermined position.

According to an embodiment, there is provided a light emitting device module comprising a light emitting device package and a printed circuit board to which the light emitting device package is coupled, wherein the light emitting device package includes a screw protrusion and the printed circuit board includes a screw groove to which the screw protrusion is coupled.

According to the embodiments, since the light emitting device package is slidingly coupled with the printed circuit board, separate soldering is unnecessary. Thus, the light emitting device package may be prevented from being damaged or broken due to heat generated upon soldering.

The light emitting device package includes the sliding grooves and the printed circuit board includes the sliding protrusions corresponding to the sliding grooves so that the light emitting device package may be easily coupled with the PCB. Due to the sliding protrusions and sliding grooves, the light emitting device package may easily slide on the printed circuit board when coupled to the printed circuit board or removed from the printed circuit board.

Also, the fixing groove is formed on the bottom surface of the light emitting device package, and the fixing protrusion is formed on the printed circuit board so that when the light emitting device package is located at a predetermined position, the fixing protrusion is coupled to the fixing groove. Thus, the light emitting device package coupled to the printed circuit board may be prevented from being easily removed out of the printed circuit board and a user may easily notice where the light emitting device package is coupled to the printed circuit board.

DETAILED DESCRIPTION OF THE EXEMPLARY EMBODIMENTS

Figure 1:
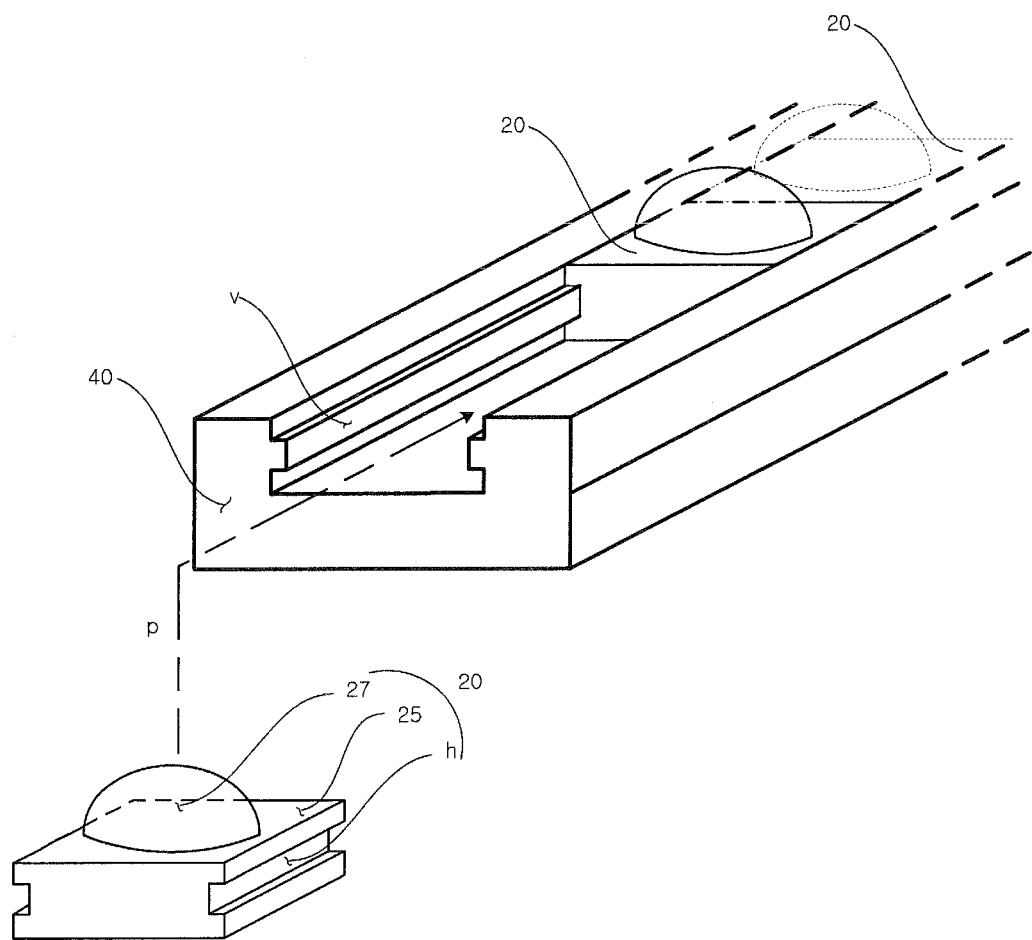
FIG. 1 is a perspective view schematically illustrating a light emitting device module according to an embodiment.

Hereinafter, exemplary embodiments will be described in detail with reference to the accompanying drawings, wherein the same reference numerals are used to denote the same or substantially the same elements throughout the specification and the drawings. In the drawings, it will be understood that when a layer (or film, region, pattern, or substrate) is referred to as being 'on' or 'under' another layer (or film, region, pattern, or substrate), it can be directly on or under the other layer (or film, region, pattern, or substrate), or intervening layers may also be present.

In the drawings, the dimensions, such as sizes or thicknesses, of layers or films are exaggerated, omitted, or schematically shown for clarity of illustration. Accordingly, the sizes of the elements in the drawings do not thoroughly reflect real sizes of elements.

Angles and directions described herein are based on those shown in the drawings. Reference points of angles and locations of LED array structures, which are not clearly described herein, are based on those shown in the drawings.

FIG. 1 is a perspective view schematically illustrating a light emitting device module according to an embodiment.

Referring to FIG. 1, a light emitting device module 100 includes a printed circuit board 40 and a plurality of light emitting device packages 20 that are arranged on the printed circuit board 40.

Each of the light emitting device packages 20 includes a light emitting device (not shown), a body 25 in which the light emitting device is mounted, and a lens 27 that covers the light emitting device on the body 25.

FIG. 1 illustrates an example where two of the light emitting device packages 20 are coupled with the printed circuit board 40 and the other one of the light emitting device packages 20 remains removed from the printed circuit board 40.

The light emitting device package 20 slides along sliding protrusions v formed on the printed circuit board 40 to a predetermined position in a direction p with the sliding protrusions engaged to sliding grooves h formed at side surfaces of the body 25.

Although it has been illustrated that the sliding grooves h are formed at the side surfaces of the body 25, the embodiments are not limited thereto. For example, the sliding grooves h may be formed at a lower surface of the body 25.

The sliding protrusions v of the printed circuit board 40 may be formed to correspond to the sliding grooves h.

FIG. 2 to 5 are a cross-sectional view illustrating a light emitting device module according to an embodiment. It will now be described with reference to FIGS. 2 and 3 that a light emitting device package (not shown) and a printed circuit board (not shown) are separated from each other.

The light emitting device package includes a light emitting device 21, a body 25, and a lens 27.

The body 25 includes first and second lead frames 22 and 23 that transfer power from an external power source (not shown) to the light emitting device 21.

The body 25 may be formed of at least one of a resin, such as polyphthalamide (PPA), silicon (Si), aluminum (Al), aluminum nitride (AlN), AlOx, photo sensitive glass (PSG), polyamide 9T (PA9T), syndiotactic polystyrene (SPS), metal, sapphire ($Al_2O_3$), beryllium oxide (BeO), or a printed circuit board (PCB). The body 25 may be formed by, but not limited to, injection molding or etching.

The first and second lead frames 22 and 23 may be formed of a metal, for example, one or more or an alloy of titanium (Ti), copper (Cu), nickel (Ni), gold (Au), chrome (Cr), tantalum (Ta), platinum (Pt), tin (Sn), silver (Ag), phosphorous (P), aluminum (Al), indium (In), palladium (Pd), cobalt (Co), silicon (Si), germanium (Ge), hafnium (Hf), ruthenium (Ru), or iron (Fe). The first and second lead frames 22 and 23 may have, but not limited to, a single layer or a multilayer structure.

According to an embodiment, the body 25 may be formed of a metallic material, and an insulation film (not shown) may be formed on a surface of the body 25 to prevent the body 25 from form a short circuit with the first and second lead frames 22 and 23.

An upper portion of the body 25 may have various shapes, such as a triangle, a rectangle, a polygon, or a circle, depending on use and design of the light emitting device packages.

The body 25 has a cavity 26 in which the light emitting device 21 is positioned. The cavity 26 may have a cross section of a cup shape or a concave vessel, and an inner surface of the cavity 26 may be perpendicular to a lower portion of the cavity 26 or inclined with respect to a line perpendicular to the lower portion.

A front surface of the cavity 26 may have a shape such as, but not limited to, a circle, a rectangle, a polygon, or an ellipse.

The light emitting device 21 may be electrically connected to the first and second lead frames 22 and 23 by wire bonding.

According to an embodiment, when the light emitting device 21 is a horizontal-type light emitting device, the light emitting device 21 may be electrically connected to the first and second lead frames 22 and 23 by metal lines.

According to an embodiment, when the light emitting device 21 is a vertical-type light emitting device which is mounted on the second lead 23, the light emitting device 21 may be wire-bonded to the first lead frame 22 but not to the second lead frame 23.

According to an embodiment, when the light emitting device 21 is a flip-type light emitting device, the light emitting device 21 may be electrically connected to the first and second lead frames 22 and 23 by a die bonding method. etc.

According to an embodiment, a sealant (not shown) may be filled in the cavity 26 to cover the light emitting device 21.

The light emitting device package includes first and second sliding grooves h1 and h2 at first and second side surfaces 25a and 25b, respectively, of the body 25 and a fixing groove h3 at a bottom surface of the body 25.

First and second lead frames 22 and 23 are formed on the first and second side surfaces 25a and 25b, respectively.

Figure 2:
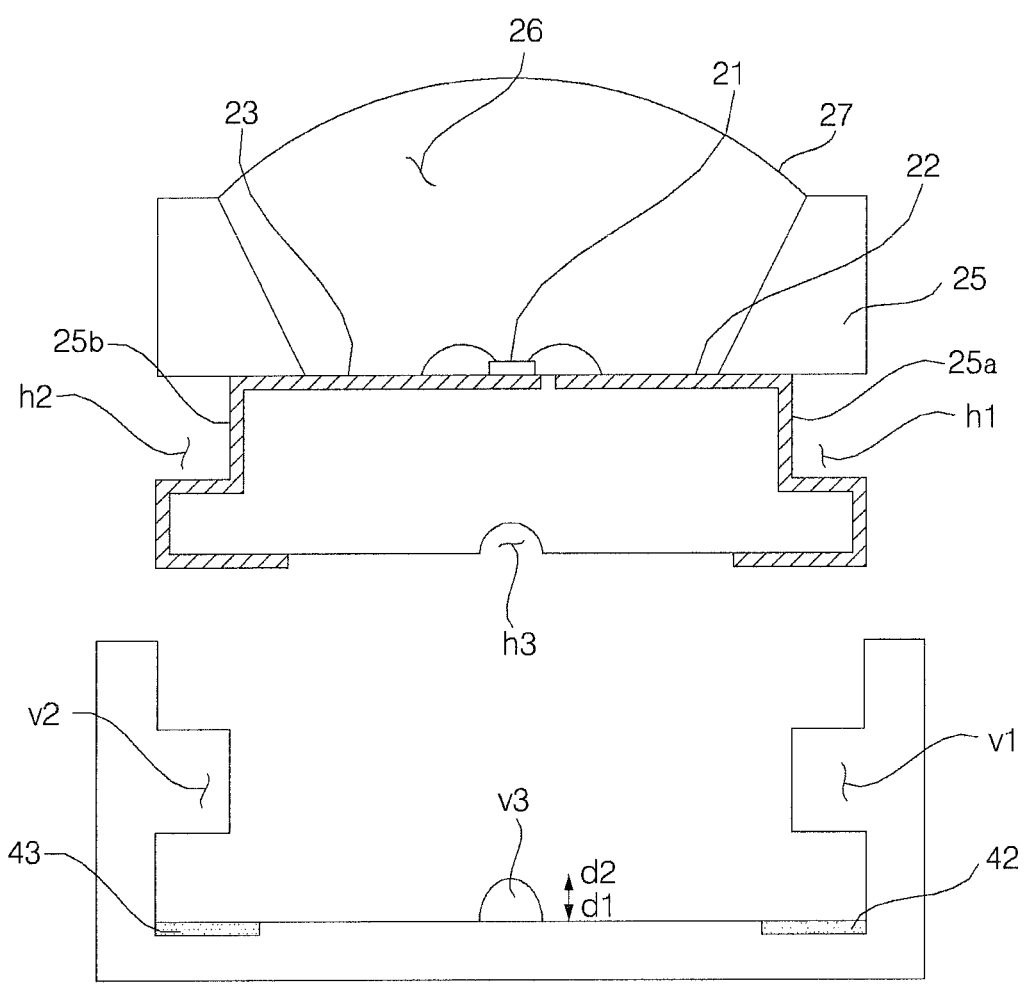
FIG. 2 to 5 are a cross-sectional view illustrating a light emitting device module according to an embodiments.
Figure 3:
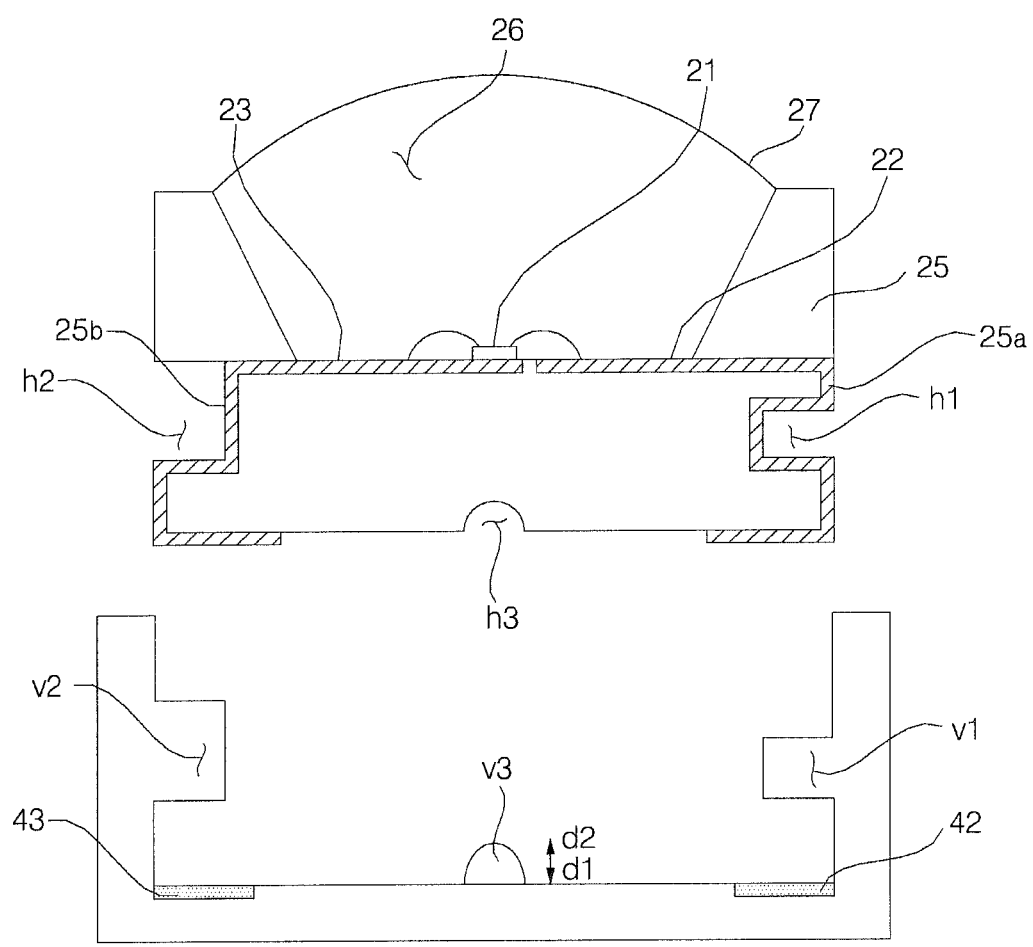

Referring to FIG. 2, the first and second sliding grooves h1 and h2 are formed at the first and second side surfaces 25a and 25b at a same height from the bottom surface of the body 25 respectively and referring to FIG. 3, the first and second sliding grooves h1 and h2 are formed at the first and second side surfaces 25a and 25b at a different height from the bottom surface of the body 25 respectively.

Referring to FIG. 2 the first and second sliding grooves h1 and h2 are the same as at least one selected from the group consisting of deep, height, width, and shape.

On the other hands, Referring to FIG. 3 the first and second sliding grooves h1 and h2 are the different as at least one selected from the group consisting of deep, height, width, and shape.

In the case that the first and second sliding grooves h1 and h2 are formed at a same height from the bottom surface of the body 25 respectively as shown in FIG. 2, when the light emitting device package slides along the first and second sliding protrusions v1 and v2 of the printed circuit board, the light emitting device package experiences less distortion.

In the case that the first and second sliding grooves h1 and h2 are formed at a different height from the bottom surface of the body 25 respectively as shown in FIG. 3, the light emitting device package experiences less distortion when sliding along the first and second sliding protrusions v1 and v2 and a user may easily realize polarities of the electrodes formed in the grooves.

FIGS. 2 and 3 are different from each other in that the first and second sliding grooves h1 and h2 are formed in FIG. 2 and in FIG. 3. The first and second sliding protrusions v1 and v2 of the printed circuit board may have different positions from each other correspond to positions of the first and second sliding grooves.

The first and second lead frames 22 and 23 may be extended via the first and second side surfaces 25a and 25b up to a bottom surface of the body 25. The first and second sliding grooves h1 and h2 may be formed to be angled.

The fixing groove h3 may have a cross section of a semicircle and may be formed at a central portion on the bottom surface of the body 25. However, the embodiments of the present invention are not limited thereto. The fixing groove h3 may also be formed at a peripheral portion on the bottom surface of the body 25. The fixing groove h3 is engaged to a fixing protrusion v3 formed on the printed circuit board.

The printed circuit board shown in FIG. 2 is the same as the printed circuit board shown in FIG. 3 except for the positions and shapes of the first and second sliding protrusions v1 and v2.

The printed circuit board includes first and second copper foil patterns 42 and 43 that contact the first and second lead frames 22 and 23, respectively, and supply power to the light emitting device package. As described above, the printed circuit board includes the first and second protrusions v1 and v2 and the fixing protrusion v3. The first and second protrusions v1 and v2 are engaged to the first and second sliding grooves h1 and h2, respectively, while the light emitting device package is slidingly moved. The third fixing protrusion v3 is engaged to the fixing groove h3 to fix the light emitting device package.

The first and second sliding protrusions v1 and v2 may be shaped to correspond to the first and second sliding grooves h1 and h2, respectively. According to an embodiment, the first and second copper foil patterns 42 and 43 may be formed on side surfaces of the first and second sliding protrusions v1 and v2, respectively.

While the light emitting device package slides on the printed circuit board, the fixing protrusion v3 is compressed in a first vertical direction d1 until the fixing protrusion v3 is engaged to the fixing groove h3. When positioned to be engaged to the fixing groove h3, the compressed fixing protrusion v3 is restored to its original state in a second vertical direction d2. For example, the fixing protrusion v3 may have elasticity.

The fixing protrusion v3 is shaped as a dome, but not limited thereto.

According to an embodiment, the fixing protrusion v3 may have an empty space in a central portion. The fixing protrusion v3 may be separately attached on the printed circuit board. However, the embodiments are not limited thereto.

According to embodiments, the fixing protrusion v3 may have the same or smaller diameter as/than a diameter of the fixing groove h3. By doing so, a gap may be created between the fixing protrusion v3 and the fixing groove h3 when the fixing protrusion v3 is coupled to the fixing groove h3, thus facilitating to change light emitting device packages.

When a diameter of the fixing protrusion v3 is larger than a diameter of the fixing groove h3, the first and second lead frames 22 and 23 may fail to electrically contact the first and second copper foil patterns 42 and 43.

Although one fixing protrusion v3 is formed in the figures, the embodiments are not limited thereto. According to an embodiment, a plurality of fixing protrusions may be formed.

It will now be described with reference to FIGS. 4 and 5 that a light emitting device package (not shown) and a printed circuit board (not shown) are separated from each other.

The same or substantially the same parts as those described in connection with FIGS. 2 and 3 will be briefly described or description thereof is not repeated.

The light emitting device package includes first and second sliding grooves h1 and h2 at first and second side surfaces 25a and 25b of the body 25 and first and second fixing grooves h3 and h4 at a bottom surface of the body 25.

The first and second lead frames 22 and 23 are not formed at the first and second sliding grooves h1 and h2, but formed at the first and second fixing grooves h3 and h4.

The first and second lead frames 22 and 23 may be external lead frame terminals that supply power from an external power source (not shown) to the light emitting device.

Figure 4:
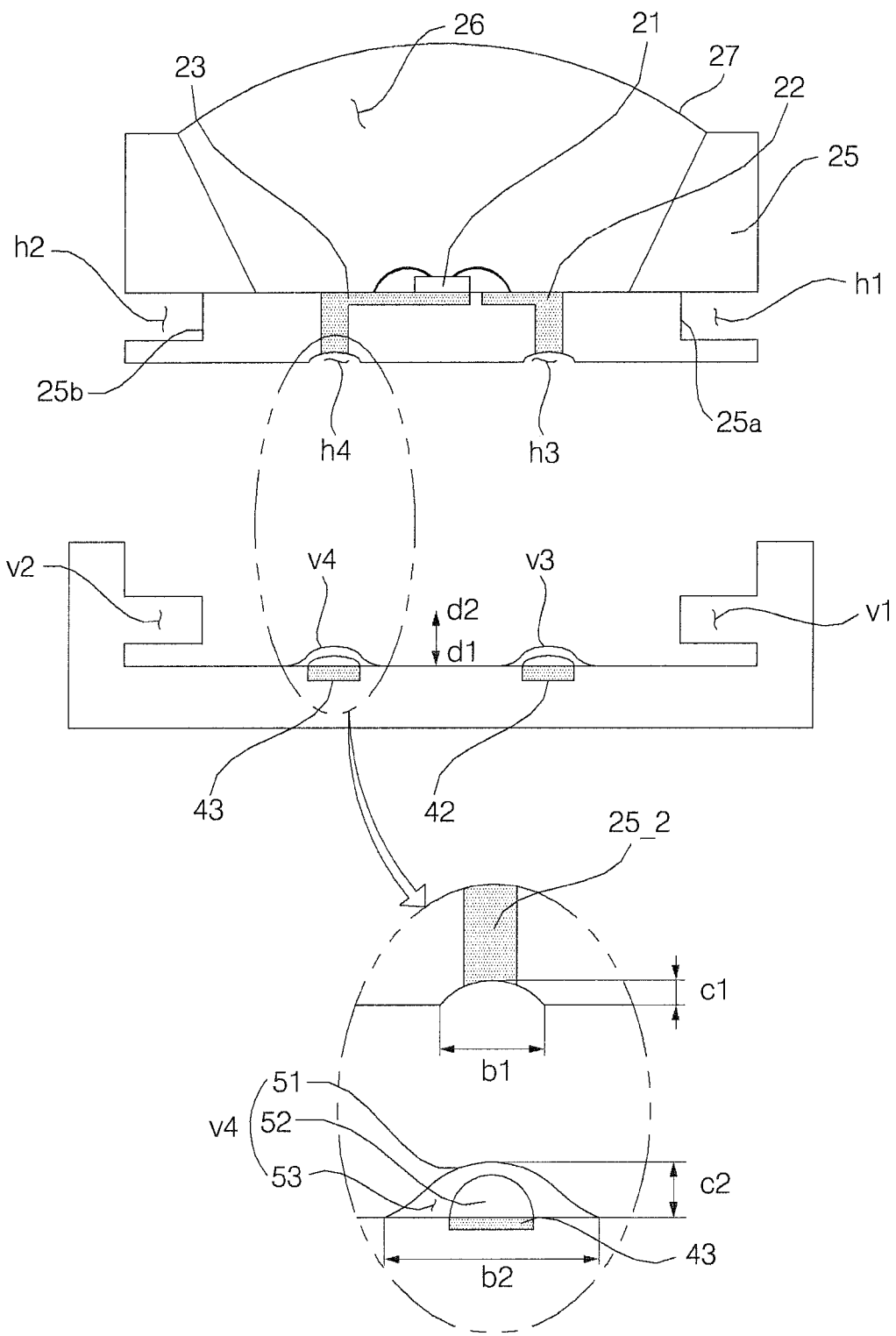

As shown in FIG. 4, the first and second sliding grooves h1 and h2 may be formed at the first and second side surfaces 25a and 25b, at a same height from the bottom surface of the body 25 respectively.

As shown in FIG. 4, the first and second sliding grooves h1 and h2 may be formed at the first and second side surfaces 25a and 25b at a different height from the bottom surface of the body 25 respectively.

In addition, the first and second sliding grooves h1 and h2 are the same as at least one selected from the group consisting of deep, height, width, and shape.

In the case that the first and second sliding grooves h1 and h2 are formed at a same height from the bottom surface of the body 25 respectively as shown in FIG. 4, when the light emitting device package slides along the first and second sliding protrusions v1 and v2 of the printed circuit board, the light emitting device package experiences less distortion. In the case that the first and second sliding grooves h1 and h2 are formed at a different height from the bottom surface of the body 25 respectively as shown in FIG. 5, the light emitting device package experiences less distortion when sliding along the first and second sliding protrusions v1 and v2 and a user may easily realize polarities of the electrodes formed in the grooves.

Figure 5:
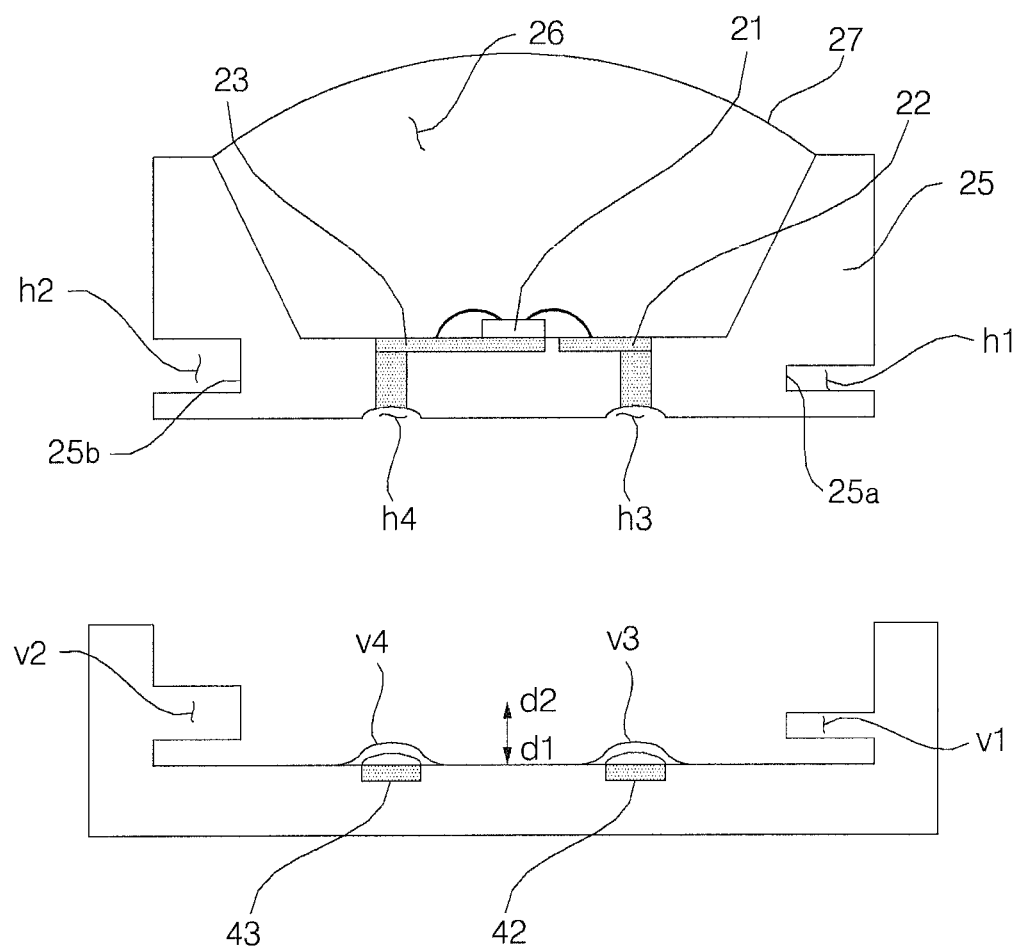

FIGS. 4 and 5 are different from each other in that the first and second sliding grooves h1 and h2 are formed o in FIG. 4 and in FIG. 5. The first and second sliding protrusions v1 and v2 of the printed circuit board may have different positions from each other.

Each of the first and second fixing grooves h3 and h4 includes a first height c1 and a first diameter b1. The first and second fixing grooves h3 and h4 may have the same distance from a central portion of the body 25.

The first and second lead frames 22 and 23 are formed in the first and second fixing grooves h3 and h4, respectively, to supply power from an external power source (not shown) to the light emitting device when the light emitting device package is fixed on the print circuit board.

Although it has been described that two fixing grooves h3 and h4 are formed, three or more fixing grooves may be formed as well. For example, when three fixing grooves are formed, one of the fixing grooves may be a dummy groove that is purely used for fixation with no lead frame formed therein while two of the fixing grooves have lead framed therein.

The print circuit board includes the first and second sliding protrusions v1 and v2 engaged to the first and second sliding grooves h1 and h2 to slidingly move the light emitting device package and first and second fixing protrusions v3 and v4 coupled to the first and second fixing grooves h3 and h4, respectively, to fix the light emitting device package. First and second copper foil patterns 42 and 43 are formed on the first and second fixing protrusions v3 and v4, respectively. The first and second copper foil patterns 42 and 43 contact the first and second lead frames 22 and 23, respectively, to supply power from an external power source (not shown) to the light emitting device.

The first and second sliding protrusions v1 and v2 may have the same cross section as the first and second sliding grooves h1 and h2, respectively.

While the light emitting device package slides on the print circuit board, the first and second fixing protrusions v3 and v4 are compressed in a first vertical direction d1 until the first and second fixing protrusions v3 and v4 are engaged to the first and second fixing grooves h3 and h4. When positioned to be engaged to the first and second fixing grooves h3 and h4, the compressed first and second fixing protrusions v3 and v4 are restored to its original state in a second vertical direction d2 so that the first and second lead frames 22 and 23 formed at the first and second fixing grooves h3 and h4 are electrically connected to the first and second copper foil patterns 42 and 43, respectively.

A height c2 of the first and second fixing protrusions v3 and v4 is higher than a height c1 of the first and second fixing grooves h3 and h4. When the light emitting device package is positioned on the first and second fixing protrusions v3 and v4, the first and second fixing protrusions v3 and v4 are engaged to the first and second fixing grooves h3 and h4 to fix the light emitting device package.

In other words, when the first and second fixing protrusions v3 and v4 are coupled to the first and second fixing grooves h3 and h4, the first and second lead frames 22 and 23 are brought in contact with the first and second copper foil patterns 42 and 43 and a gap is formed at portions other than where the first and second fixing protrusions v3 and v4 contact the first and second fixing grooves h3 and h4 to facilitate to change light emitting device packages.

The first fixing protrusion v3 includes a conductive material 52 and a metal film 51 is flexible that are sequentially stacked on the first copper foil pattern 42, and the second fixing protrusion v4 includes a conductive material 52 and a metal film 51 is flexible that are sequentially stacked on the second copper foil pattern 43.

A space 53 is formed between the metal film 51 and the conductive material 52. When the first and second fixing grooves h3 and h4 are positioned on the first and second fixing protrusions v3 and v4, the conductive materials 52 are brought in contact with the metal films 51 so that the first and second lead frames 22 and 23 are electrically connected to the first and second copper foil patterns 42 and 43, respectively.

A diameter b2 of the metal film 51 is larger than a diameter b1 of the first and second fixing grooves h3 and h4.

In other words, the diameter b2 of the metal film 51 is reduced same with the diameter b1 by the first and second fixing grooves h3 and h4 coupled of the first and second fixing protrusions v3 and v4.

Thus, the conductive materials 52 are brought in contact with the metal films 51 so that the first and second lead frames 22 and 23 are electrically connected to the first and second copper foil patterns 42 and 43.

A diameter of the conductive material 52 is identical to the diameter b1 of the first and second fixing grooves h3 and h4. However, the embodiments are not limited thereto.

Although it has been described that two protrusions are formed, more than two protrusions may be formed.

Although it has been described that each of the first and second fixing protrusions v3 and v4 is shaped as a v4 may have other shapes.

FIGS. 6 to 9 illustrate various shapes of the first sliding groove h1 described above in connection with FIGS. 2 to 5 according to embodiments. And, shapes of the first and second sliding protrusions v1 and v2 may be transformed to the corresponding by shapes of the first and second sliding groove h1 and h2.

Figure 6:
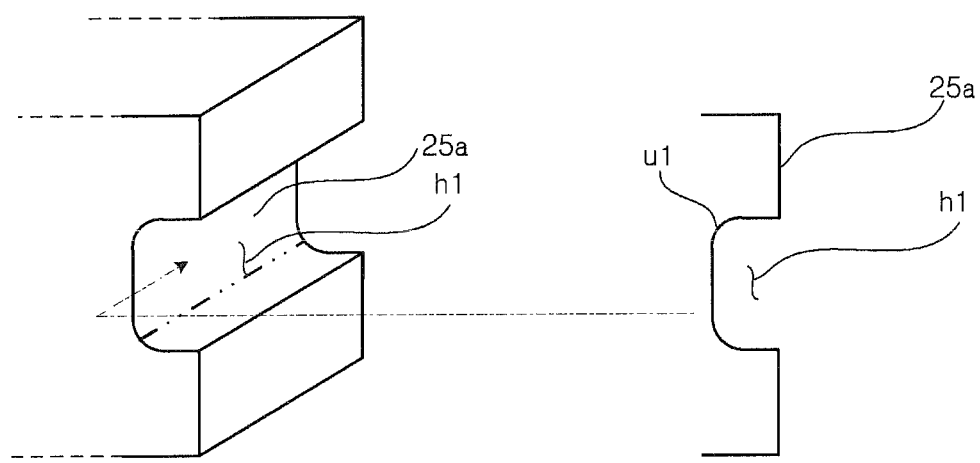
FIGS. 6 to 9 are views illustrating various shapes of a sliding groove according to embodiments.

The second sliding groove h2 may have the same shape as that of the first sliding groove h1. According to embodiments, the second sliding groove h2 may differ from the first sliding groove h1 in at least one of width and height. The first sliding groove h1 may be defined by the first side surface 25a of the body 25. Referring to FIG. 6, the first sliding groove h1 is formed to be depressed from the first side surface 25a by a predetermined depth. The first sliding groove h1 may have a rounded portion with a curvature u1.

The rounded portion helps the light emitting device package to be more smoothly moved along the first sliding protrusion V1.

Figure 7:
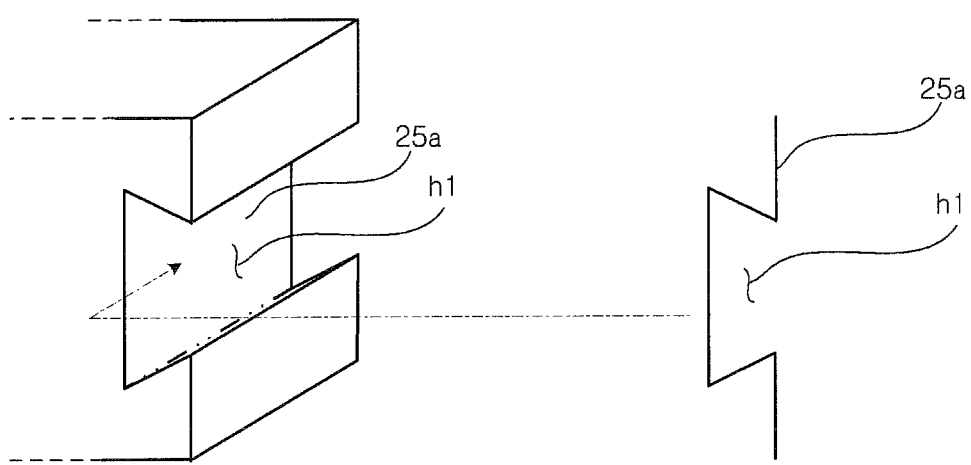

Referring to FIG. 7, the first sliding groove h1 may be shaped as a trapezoid. Specifically, the first sliding groove h1 may have a trapezoidal cross section. This may increase an area where the first sliding groove h1 is brought in contact with the first sliding protrusion v1, thus preventing the light emitting device package from being distorted when slidingly moved.

Figure 8:
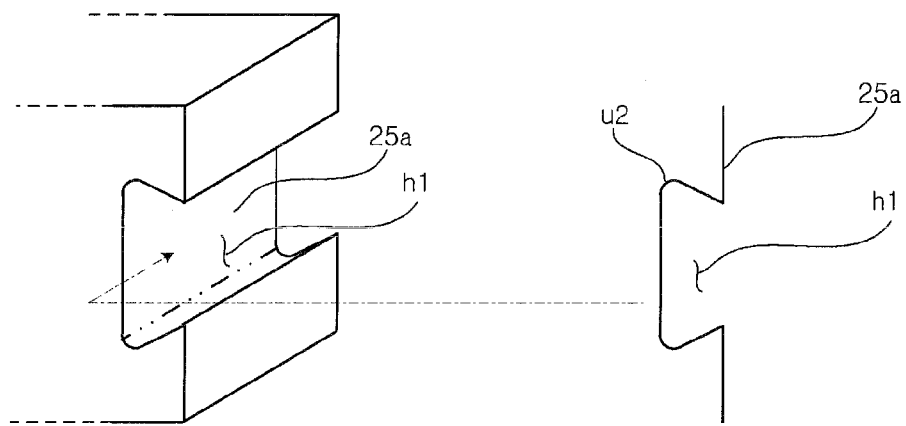

Referring to FIG. 8, the first sliding groove h1 is shaped as substantially a trapezoid with rounded edges, each having a curvature u2, thus preventing the light emitting device package from being distorted and allowing the light emitting device package to be more smoothly moved along the first sliding protrusion v1.

Figure 9:
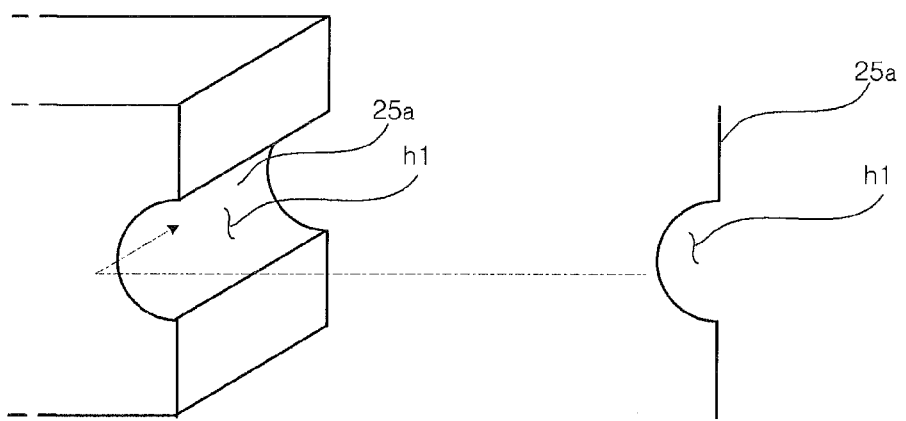

Referring to FIG. 9, the first sliding groove h1 is shaped as a semicircle. More specifically, a cross section of the first sliding groove h1 is semicircular. This provides an enhanced sliding movement.

Figure 10:
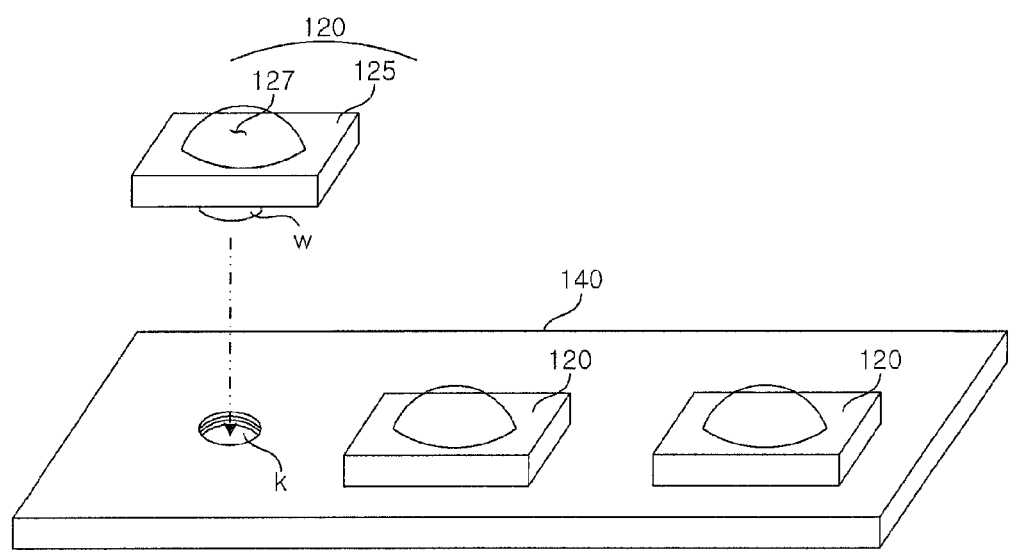
FIG. 10 is a perspective view schematically illustrating a light emitting device module according to an embodiment.
Figure 11:
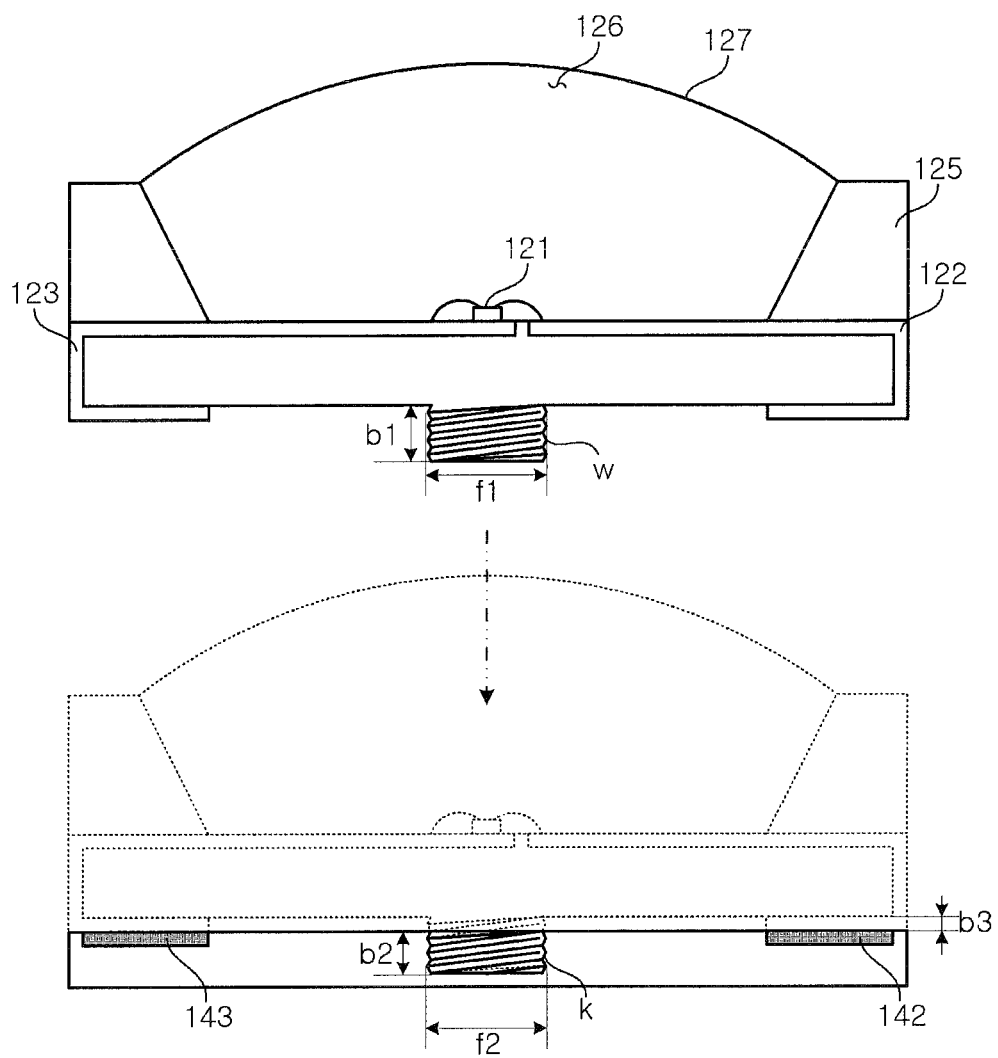
FIG. 11 is a cross-sectional view illustrating a light emitting device module according to an embodiment.

FIG. 10 is a perspective view schematically illustrating light emitting device module according to an embodiment. FIG. 11 is a cross-sectional view of the light emitting device module shown in FIG. 10.

Referring to FIGS. 10 and 11, the light emitting device module includes light emitting device packages 120 and a printed circuit board 140 to which the light emitting device packages 120 are coupled.

Each of the light emitting device packages 120 includes an light emitting device 121, a body 125 in which the light emitting device 121 is arranged, and a lens 127 covering the light emitting device 121 on the body 125.

FIG. 10 illustrates an example where two light emitting device packages 120 remain coupled to the printed circuit board 140 and one light emitting device package 120 is separated from the printed circuit board 140.

According to an embodiment, the light emitting device package 120 may include a screw protrusion w on a rear surface.

Although it has been described that the screw protrusion w is integrally formed with the body 125, the screw protrusion w may be separated from the body 125.

Description on parts L of the light emitting device package 120 the same as those described in connection with FIGS. 1 and 2 will not be repeated.

A cavity 126 is formed at a front surface of the body 125. The cavity 126 is filled with a resin material (not shown) to form a lens 127.

The screw protrusion w is formed on a rear surface of the body 125.

The printed circuit board 140 may have a screw groove k to which the screw protrusion w is coupled.

The screw protrusion w has a first length b1, and the screw groove k has a depth of a second length b2.

For example, the first length b1 may be larger than the second length b2. A difference b3 between the first and second lengths b1 and b2 may be the same as a thickness of the first and second lead frames 122 and 123.

The printed circuit board 140 includes first and second copper foil patterns 142 and 143 that are symmetrically arranged to each other with respect to the screw protrusion w.

The first and second copper foil patterns 142 and 143 are electrically connected to the first and second lead frames 122 and 123, respectively, to supply power to the light emitting device 121.

According to embodiments, a width f1 of the screw protrusion w may be equal to or smaller than a width f2 of the screw groove k.

While the screw protrusion w is coupled to the screw groove k, a gap may be created between the screw protrusion w and the screw groove k.

According to an embodiment, as the screw protrusion w and the screw groove k are coupled to each other, the first and second lead frames 122 and 123 may be always constantly brought in contact with the first and second copper foil patterns 142 and 144, respectively, by adjusting threads of the screw protrusion w and the screw groove k.

Figure 12:
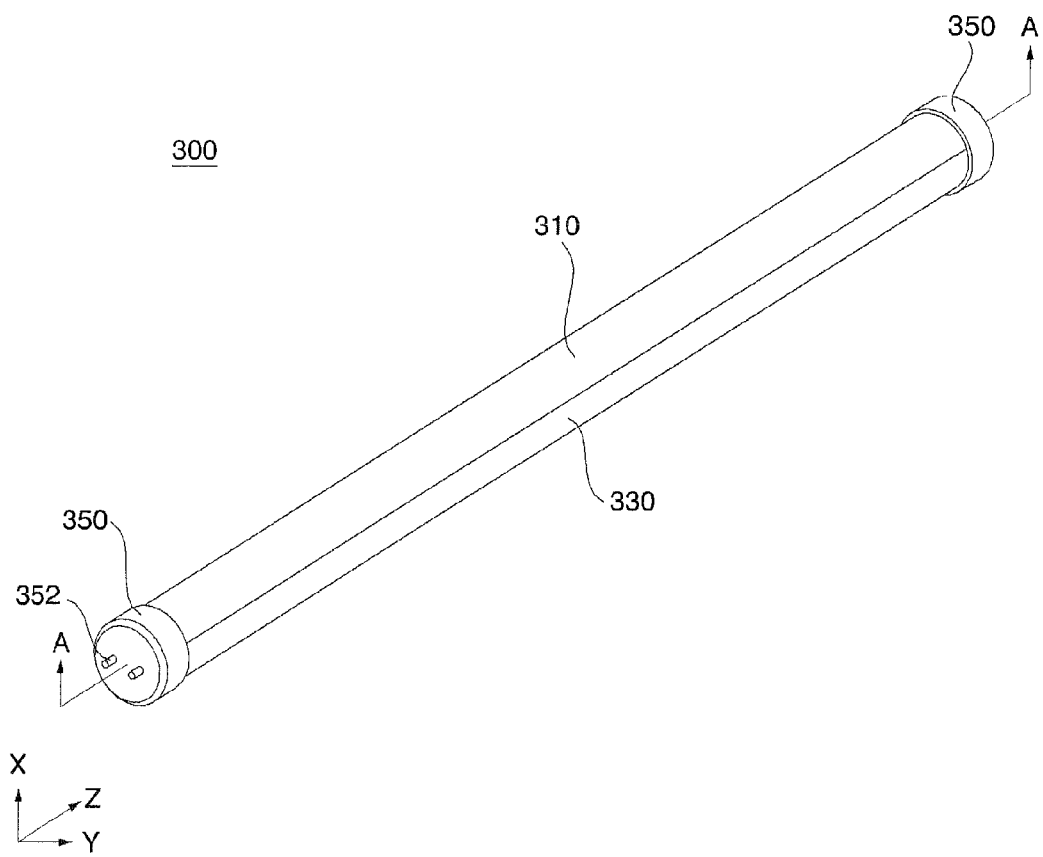
FIG. 12 is a perspective view illustrating a illumination device including a light emitting device module according to an embodiment.
Figure 13:
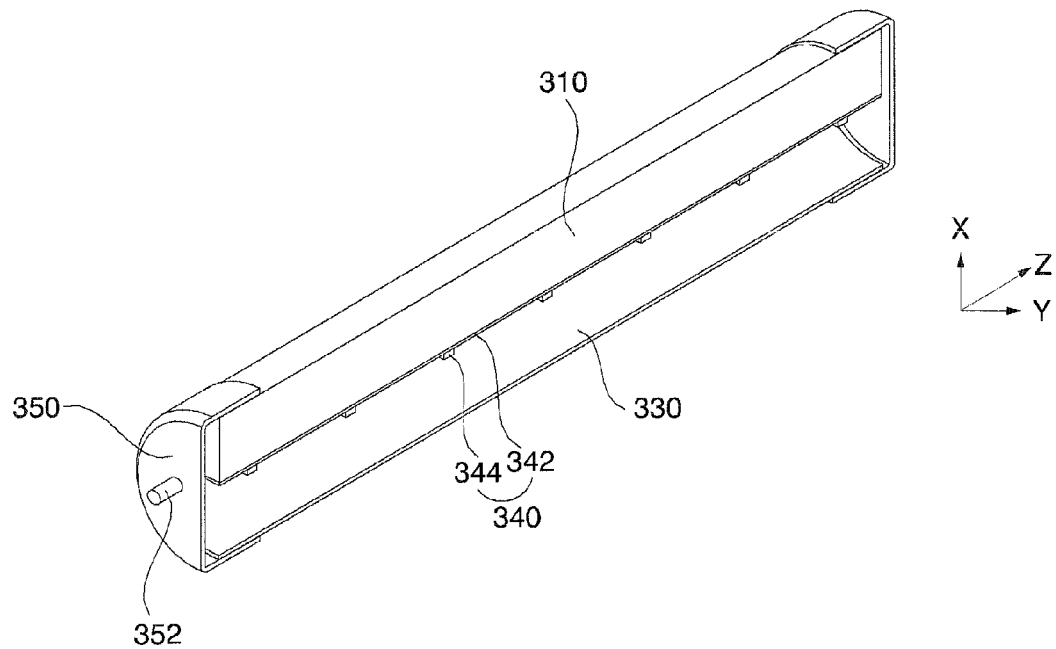
FIG. 13 is a cross-sectional view taken along line A-A of FIG. 12.

FIG. 12 is a perspective view illustrating an illumination device including a light emitting device module according to an embodiment, and FIG. 13 is a cross-sectional view taken along line A-A of FIG. 12.

Hereinafter, an illumination device 300 according to an embodiment will be described in detail with respect to a longitudinal direction Z of the illumination device 300, a horizontal direction Y perpendicular to the longitudinal direction Z, and a height direction X perpendicular to the longitudinal direction Z and the horizontal direction Y.

FIG. 13 illustrates a cross section obtained by cutting the illumination device 300 with respect to a plane defined by a lengthwise direction Z and a height direction X.

Referring to FIGS. 12 and 13, the illumination device 300 includes a body 310, a cover 330 coupled to the body 310, and sealing caps 350 positioned at both ends of the body 310.

A light emitting device module 340 is positioned at a lower surface of the body 310. The body 310 is formed of a metal having good thermal conductivity and heat diffusing effects so that heat generated from a plurality of light emitting device packages 344 may be dissipated through an upper surface of the body 310 to the outside.

The light emitting device module 340 may include the light emitting device packages 344 and a printed circuit board 342.

The light emitting device packages 344 having various colors may be arranged in various rows on the printed circuit board 342 to configure an array. According to embodiments, the light emitting device packages 344 may be spaced apart from one another by the same or different distances to adjust brightness of light. The printed circuit board 342 may include an MCPCB (Metal Core printed circuit board) or a printed circuit board formed of FR4.

Each of the light emitting device packages 344 may include a film that has a plurality of holes and is formed of a conductive material, such as a metal.

The film may cause more interference between light beams, thus leading to more interaction between the light beams and resultantly increase in strength of the light beams. Thus, the light beams may be effectively extracted and diffused. The plurality of holes formed in the film may cause interference between light beams generated from a light source (not shown) and diffraction of light beams, thereby allowing the light beams to be effectively extracted. As a consequence, an efficiency of the illumination device 300 may be enhanced. A size of each of the holes, for example, a diameter of the hole, may be smaller than a wavelength of light emitted from the light source.

The cover 330 may be formed to have a rounded shape that surrounds a lower surface of the body 310.

The cover 330 protects the light emitting device module 340 from outside unwanted materials. The cover 330 may include light diffusing particles that prevent a user from being dazzled by light emitted from the light emitting device packages 344 and that enable light to be evenly directed to the outside. According to an embodiment, a prism pattern may be formed on at least one of an inner surface and an outer surface of the cover 330.

According to an embodiment, a phosphor may be applied on at least one of an inner surface and an outer surface of the cover 330.

Light generated from the light emitting device packages 344 is exited to the outside through the cover 330. Accordingly, the cover 330 has good light transmittance and thermal resistance sufficient to endure heat generated from the light emitting device packages 344. According to embodiments, the cover 330 may include polyethylenterephthalate (PET), polycarbonate (PC), or polymethylmethacrylate (PMMA).

The sealing caps 350 are positioned at both ends of the body 310 and seal a power control module (not shown). The sealing caps 350 include pins 352 similar to pins included in an existing fluorescent lamp so that the illumination device 300 may be used instead of the fluorescent lamp without additional devices.

Figure 14:
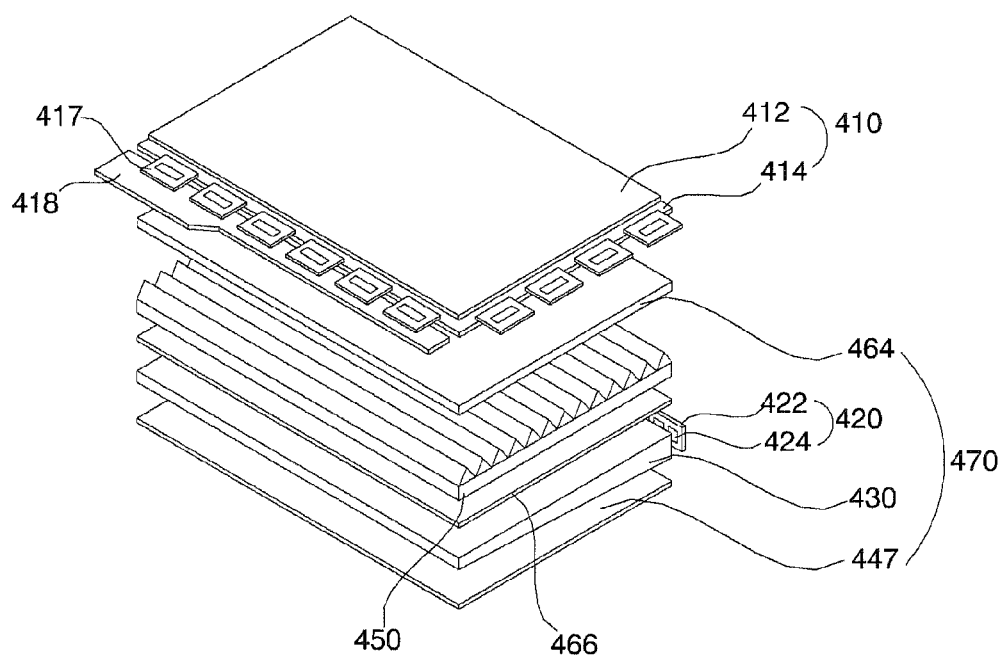
FIG. 14 is an exploded perspective view illustrating a liquid crystal display device including light emitting device module according to an embodiment.

FIG. 14 is a perspective view illustrating a liquid crystal display device including a light emitting device module according to an embodiment.

FIG. 14 illustrates a liquid crystal display apparatus 400 including an edge-light type backlight unit. The liquid crystal display 400 apparatus includes a liquid crystal display panel 410 and a backlight unit 470 that provides light to the liquid crystal display panel 410.

The liquid crystal display panel 410 displays images by using light provided from the backlight unit 470. The liquid crystal display panel 410 includes a color filter substrate 412 and a thin film transistor (TFT) substrate 414 facing the color filter substrate 412, and a liquid crystal layer between the color filter substrate 412 and the TFT substrate 414.

The color filter substrate 412 implements colors of images displayed on the liquid crystal display panel 410.

The TFT substrate 414 is electrically connected to a printed circuit board 418 on which a plurality of circuit parts are mounted through a driving film 417. The TFT substrate 414 may apply a driving voltage from the printed circuit board 418 to the liquid crystal layer in response to a driving signal provided from the printed circuit board 418.

The TFT substrate 414 may include TFTs and pixel electrodes that are formed of a thin film on a transparent substrate, such as glass or plastic.

The backlight unit 470 includes a light emitting device module 420 that emits light, a light guide plate 430 that guides light emitted from the light emitting device module 420 toward the liquid crystal display panel 410, a plurality of films 450, 466, and 464 that provide a uniform brightness distribution and enhanced vertical incidence for light coming from the light guide plate 430, and a reflection sheet 440 that is located on a rear surface of the light guide plate 420 to reflect light toward the light guide plate 420.

The light emitting device module 420 may include a printed circuit board substrate 422 and a plurality of light emitting device packages 424 arranged on the printed circuit board substrate 422 to form an array.

The light emitting device package 424 includes a film having a plurality of holes at a light emitting surface, and accordingly, no lens may be necessary, thus implementing a slim light emitting device package and leading to an enhanced light extraction efficiency. Thus, it may be possible to make the backlight unit 470 slimmer.

As described above, the backlight unit 470 may include the diffusing film 466 that diffuses light incident from the light guiding plate 430 toward the liquid crystal display panel 410, the prism film 450 that collects the scattered light and improves vertical incidence, and the protection film 464 that protects the prism film 450.

Figure 15:
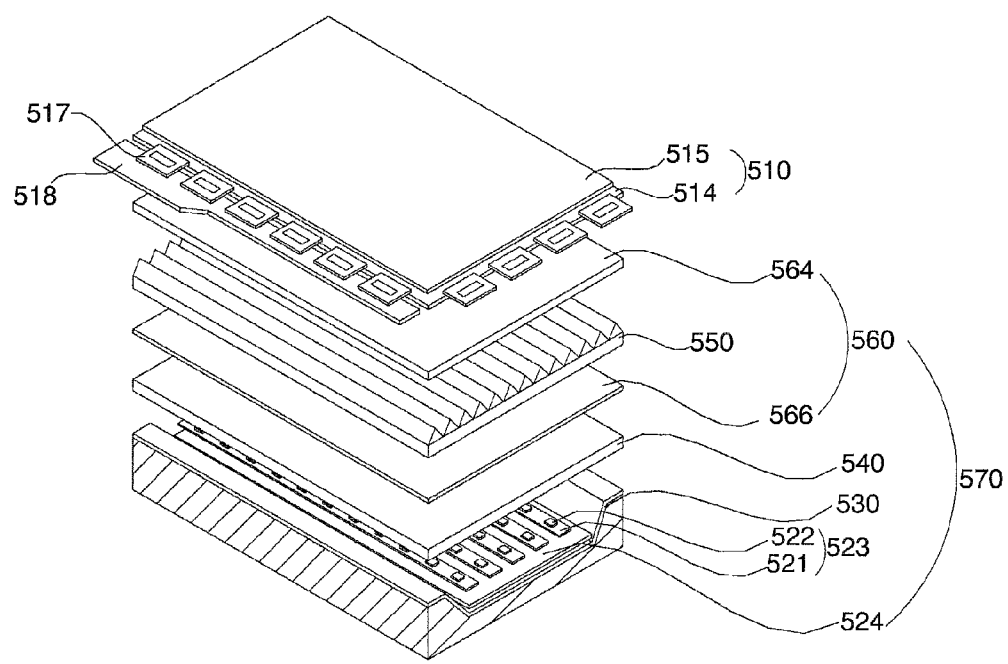
FIG. 15 is an exploded perspective view illustrating a liquid crystal display apparatus including light emitting device module according to an embodiment.

FIG. 15 is a perspective view illustrating a liquid crystal display device including a light emitting device module according to an embodiment.

Description on the same parts as those described in connection with FIG. 14 will not be repeated.

Referring to FIG. 15, the liquid crystal display device 500 includes a liquid crystal display panel 510 and a backlight unit 570 that provides light to the liquid crystal display panel 510.

The liquid crystal display panel 510 is the same as the liquid crystal display panel 410 shown in FIG. 14, and thus, detailed description thereof will not be repeated.

The backlight unit 570 includes a plurality of light emitting device modules 523, a reflection sheet 52, a lower chassis 530 receiving the light emitting device modules 523 and the reflection sheet 524, a diffusing plate 540 arranged over the light emitting device modules 523, and a plurality of optical films 560.

Each of the light emitting device modules 523 includes a printed circuit board substrate 521 and a plurality of light emitting device packages 522 arranged on the printed circuit board substrate 521 to form an array.

The light emitting device package 522 includes a film that is formed of a conductive material and has a plurality of holes at a light emitting surface, and accordingly, no lens may be necessary, thus implementing a slim light emitting device package and leading to an enhanced light extraction efficiency. Thus, it may be possible to make the backlight unit 570 slimmer.

The reflection sheet 524 reflects light generated from the light emitting device packages 522 toward the liquid crystal display panel 510, thus enhancing an efficiency in use of light.

Light generated from the light emitting device modules 523 is incident on the diffusing plate 540. The optical films 560 are arranged on the diffusing plate 540. The optical films 560 may include a diffusing film 566, a prism film 550, and a protection film 564.

The illumination 300 and the liquid crystal display device 400 or 500 may be included in a a lighting system. Besides, any device for illumination, which includes a light emitting device package, may also be included in the lighting system.

Figure 16:
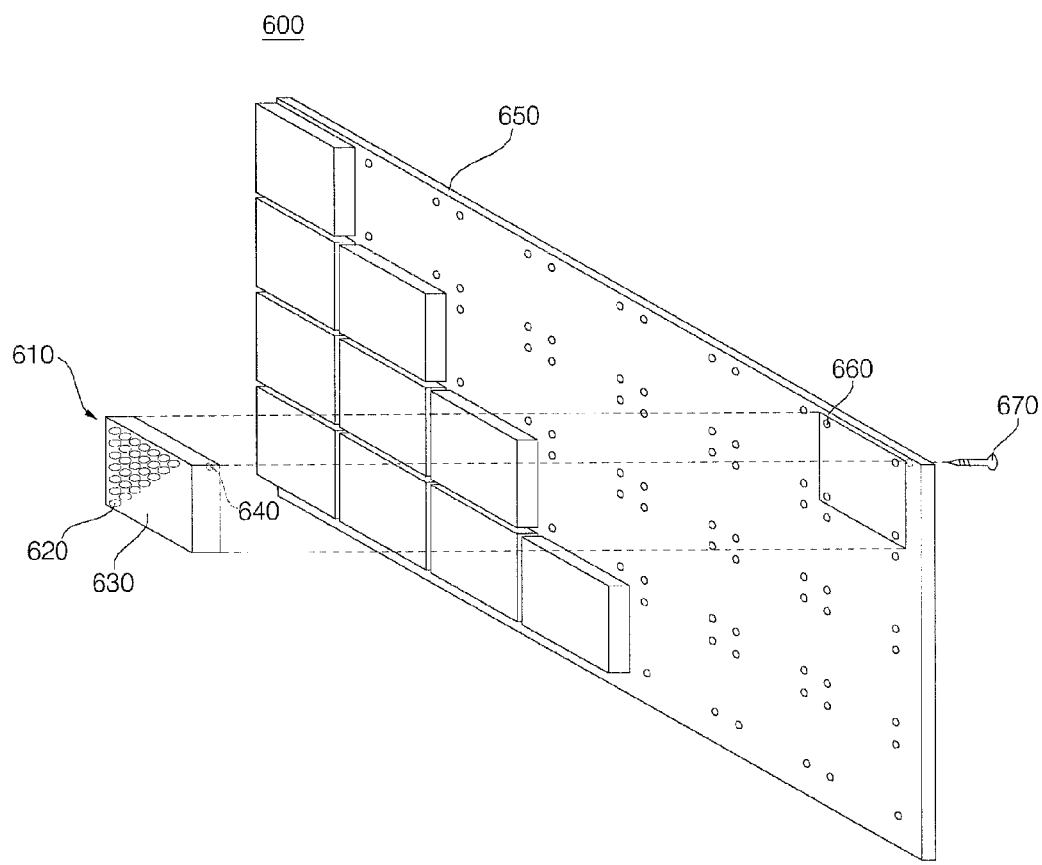
FIG. 16 is a perspective view illustrating a lighting system according to an embodiment.

FIG. 16 is a perspective view illustrating an lighting system according to an embodiment. Referring to FIG. 16, the lighting system 600 includes a light emitting device modules 610 and a frame 650.

Each of the light emitting device modules 610 includes light emitting device packages 620 and a first printed circuit board 630. The first printed circuit board 630 includes screw holes 640.

The frame 650 is formed of plastic or metal and may be shaped as a plate to which the light emitting device modules 610 may be coupled.

Although it has been described that the frame 650 is shaped as a rectangle, the embodiments of the present are not limited thereto. The frame 650 may have different shapes depending on the purpose or place of use.

The frame 650 includes fixing holes 660 at positions corresponding to the screw holes 630.

In the lighting system 600, the light emitting device module 610 may be seated on the frame 650 and the screw holes 640 are arranged to conform to the fixing holes 660.

Fixing screws 670 are screwed into the screw holes 640 and the fixing holes 660 so that the light emitting device module 610 may be fastened onto the frame 650. By unscrewing the fixing screws 670, the light emitting device module 610 may be separated from the frame 650.

For example, the light emitting device module 610 may be detachably coupled to the frame 650.

Accordingly, when any one of the plurality of light emitting device modules 610 is broken, the broken light emitting device module 610 may be replaced by a normal light emitting device module 610 by unscrewing the fixing screws 670. As a result, the number of processes may be reduced with enhanced productivity and economic feasibility.

Figure 17:
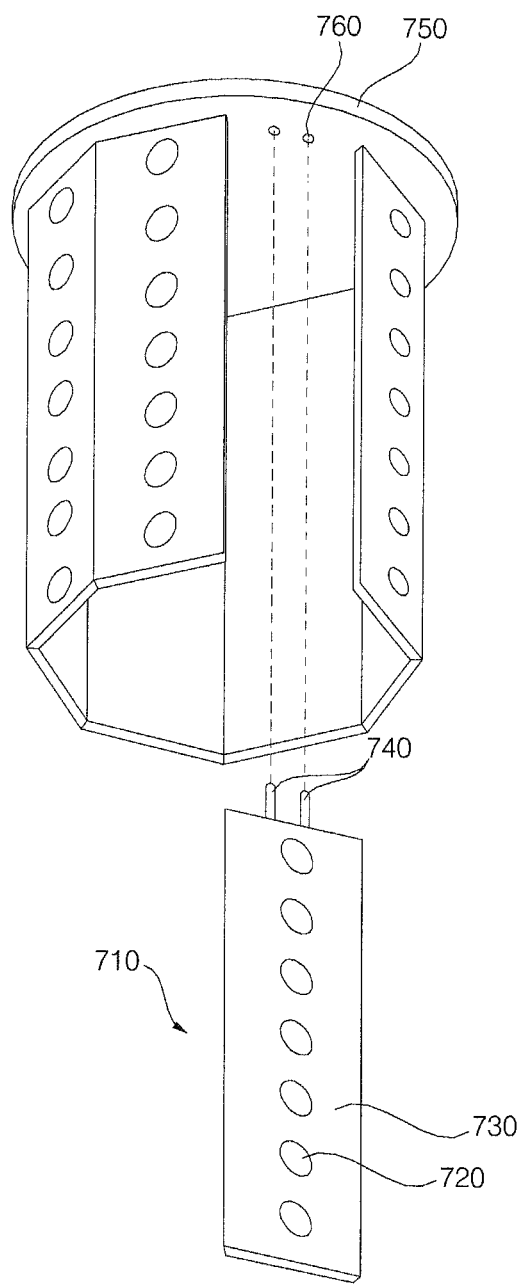
FIG. 17 is a perspective view illustrating an lighting system according to an embodiment.

FIG. 17 is a perspective view illustrating a lighting system according to an embodiment.

Referring to FIG. 17, the lighting system 700 includes a plurality of light emitting device modules 710 and a frame 750.

The frame 750 may include a second printed circuit board (not shown) that is electrically connected to the light emitting device modules 710.

According to embodiments, the frame 750 may have a shape of a polygon or a circular plate.

Although the frame 750 has been illustrated to be shaped as a circular plate, the embodiments are not limited thereto.

Each of the light emitting device modules 710 includes a plurality of light emitting device packages 720 and a first printed circuit board 730 on which the light emitting device packages 720 are mounted.

The frame 750 includes through holes 760 through which the first printed circuit board 730 is fixed and electrically connected to the frame 750.

The through holes 760 are arranged along an outer periphery of the frame 750 to have a shape of an octagon or rectangle depending on the shape of the frame 750.

The first printed circuit board 730 includes protrusion terminals 740 that are inserted into the through holes 760 to be connected with the frame 750.

The protrusion terminals 740 are coupled to the through holes 760 and supply power, which is supplied from the second printed circuit board to the first printed circuit board 730, to the light emitting device packages 720 through copper patterns (not shown) connected to the light emitting device packages 720.

For example, the light emitting device module 710 may be detachably coupled to the frame 750.

Accordingly, when any one of the plurality of light emitting device modules 710 is broken, the broken light emitting device module may be replaced by a normal one by disconnecting the protrusion terminals 740 from the through holes 760.

The embodiment has been explained above with reference to characteristic. It will be evident to those skilled in the art that various modifications may be made thereto without departing from the broader spirit and scope of the embodiment. Further, although the embodiment has been described in the context its implementation in particular environments and for particular applications, those skilled in the art will recognize that the present embodiments usefulness is not limited thereto and that the embodiment can be beneficially utilized in any number of environments and implementations. The foregoing description and drawings are, accordingly, to be regarded in an illustrative rather than a restrictive sense.

What is claimed is:

1. A tight emitting device module comprising:
a light emitting device package; and
a printed circuit board to which the light emitting device package is coupled, wherein
the light emitting device package includes a sliding groove and a fixing groove, wherein
the printed circuit board includes a sliding protrusion coupled to the sliding groove to guide the light emitting device package to a predetermined position and a fixing protrusion coupled to the fixing groove at the predetermined position,
wherein the light emitting device package includes,
a light emitting device; and
a body including a first lead frame on which the LED is arranged and a second lead frame spaced apart from the first lead frame, wherein at least one of the sliding groove and the fixing groove is formed on at least one surface of the body, and
wherein the sliding groove includes a first sliding groove formed at a first surface of the body and a second sliding groove formed at a second surface of the body, wherein the first surface is parallel to the second surface.

2. The light emitting device module of claim 1, wherein the first and second lead frames are formed on the first and second side surfaces respectively.

3. The light emitting device module of claim 1, wherein the first sliding groove is symmetrical to the second sliding groove.

4. The light emitting device module of claim 1, wherein the fixing groove is formed at a third surface different from the first and second surfaces.

5. The light emitting device module of claim 4, wherein the fixing groove includes first and second fixing grooves that are symmetrical to each other with respect to a central portion of the third surface.

6. The light emitting device module of claim 5, wherein the first lead frame is arranged in at least one of the first sliding groove and the first fixing groove, and the second lead frame is arranged in at least one of the second sliding groove and the second fixing groove.

7. The light emitting device module of claim 6, wherein the sliding protrusion includes a first sliding protrusion guided along the first sliding groove and a second sliding protrusion guided along the second sliding groove.

8. The light emitting device module of claim 7, wherein the fixing protrusion includes a first fixing protrusion coupled to the first fixing groove and a second fixing protrusion coupled to the second fixing groove.

9. The light emitting device module of claim 8, wherein the printed circuit board includes first and second patterns electrically connected to the first and second lead frames, respectively, wherein the first pattern is arranged on at least one of the first sliding protrusion and the first fixing protrusion, and the second pattern is arranged on at least one of the second sliding protrusion and the second fixing protrusion.

10. The light emitting device module of claim 1, wherein the sliding protrusion has a semicircle shape, a polygonal shape, or a rounded shape having a curvature.

11. The light emitting device module of claim 1, wherein the fixing protrusion has a semicircle shape.

12. A light emitting device module comprising:
a light emitting device package; and
a printed circuit board to which the light emitting device package is coupled, wherein
the light emitting device package includes a sliding groove and a fixing groove, and wherein
the printed circuit board includes a sliding protrusion coupled to the sliding groove to guide the light emitting device package to a predetermined position and a fixing protrusion coupled to the fixing groove, at the predetermined position, wherein the fixing protrusion has elasticity in a vertical direction.

13. A light emitting device module comprising:
a light emitting device package; and
a printed circuit hoard to which the light emitting device package is coupled, wherein
the light emitting device package includes a sliding groove and a fixing groove, and wherein
the printed circuit board includes a sliding protrusion coupled to the sliding groove to guide the light emitting device package to a predetermined position and a fixing protrusion coupled to the fixing groove at the predetermined position, wherein a gap is formed between the fixing protrusion and the fixing groove.

14. The light emitting device module of claim 12, wherein the light emitting device package includes,
a light emitting device; and
a body including a first lead frame on which the LED is arranged and a second lead frame spaced apart from the first lead frame, wherein at least one of the sliding groove and the fixing groove is formed at least one surface of the body.

15. The Light emitting device module of claim 13, wherein the light emitting device package includes,
a light emitting device; and
a body including a first lead frame on which the LED is arranged and a second lead frame spaced apart from the first lead frame, wherein at least one of the sliding groove and the fixing groove is formed at least one surface of the body.

* * * * *